United States Patent [19]

Hamada et al.

[11] Patent Number: 5,016,252
[45] Date of Patent: May 14, 1991

[54] SEMICONDUCTOR LASER DEVICE

[75] Inventors: Hiroki Hamada; Shoji Honda; Masayuki Shono; Takao Yamaguchi, all of Osaka, Japan

[73] Assignee: Sanyo Electric Co., Ltd., Osaka, Japan

[21] Appl. No.: 412,786

[22] Filed: Sep. 26, 1989

[30] Foreign Application Priority Data

Sep. 29, 1988 [JP] Japan ................................ 63-245148
Mar. 20, 1989 [JP] Japan .................................... 1-68784
Mar. 31, 1989 [JP] Japan .................................... 1-83107

[51] Int. Cl.$^5$ ............................................. H01S 3/19
[52] U.S. Cl. ......................................... 372/45; 357/17
[58] Field of Search ...................... 372/44, 45; 357/17, 357/60

[56] References Cited

U.S. PATENT DOCUMENTS 4,581,742  4/1986  Botez ................................... 372/45

OTHER PUBLICATIONS

Isao Hino et al, MOCVD Growth of $(Al_xGa_{1-x})_yIn_{1-y}P$ and Double Heterostructures for Visible Light Lasers, Journal of Crystal Growth 68, Jan. (1984), pp. 483–489.
Tohru Suzuki et al, Band-Gap Anomaly and Sublattice Ordering in GaInP and AlGaInP Grown by Metalorganic Vapor Phase Epitaxy, Japanese Journal of Applied Physics, vol. 27, No. 11, Nov. 1988, pp. 2098–2106.
S. Kawata et al, Room-Temperature, Continuous-Wave Operation for Mode-Stabilized AlGaInP Visible-Light Semiconductor Laser with a ..., Electronics Letters 24, Nov. 1988, vol. 24, No. 24, pp. 1489–1490.
Kenichi Kobayashi et al, AlGaInP Double Heterostructure Visible-Light Laser Diodes with a GaInP ..., IEEE Journal of Quantum Electronics, vol. QE-23, No. 6, Jun. 1987, pp. 704–711.
J. V. Dilorenzo, Vapor Growth of Eitaxial GaAs: A Summary of Parameters which Influence the Purity ..., Journal of Crystal Growth 17 (1972), Jan., pp. 189–206.
M. Wada et al, Monolithic High-Power Dual-Wavelength GaAlAs Laser Array, Appl. Phys. Lett., vol. 43, No. 10, Nov. 15, 1983, pp. 903–905.

Primary Examiner—Georgia Epps
Attorney, Agent, or Firm—Darby & Darby

[57] ABSTRACT

A semiconductor laser device of an AlGaInP system includes a GaAs substrate and a surface of the substrate is inclined by 5° or more from a {100} plane in a <011> direction.

10 Claims, 9 Drawing Sheets

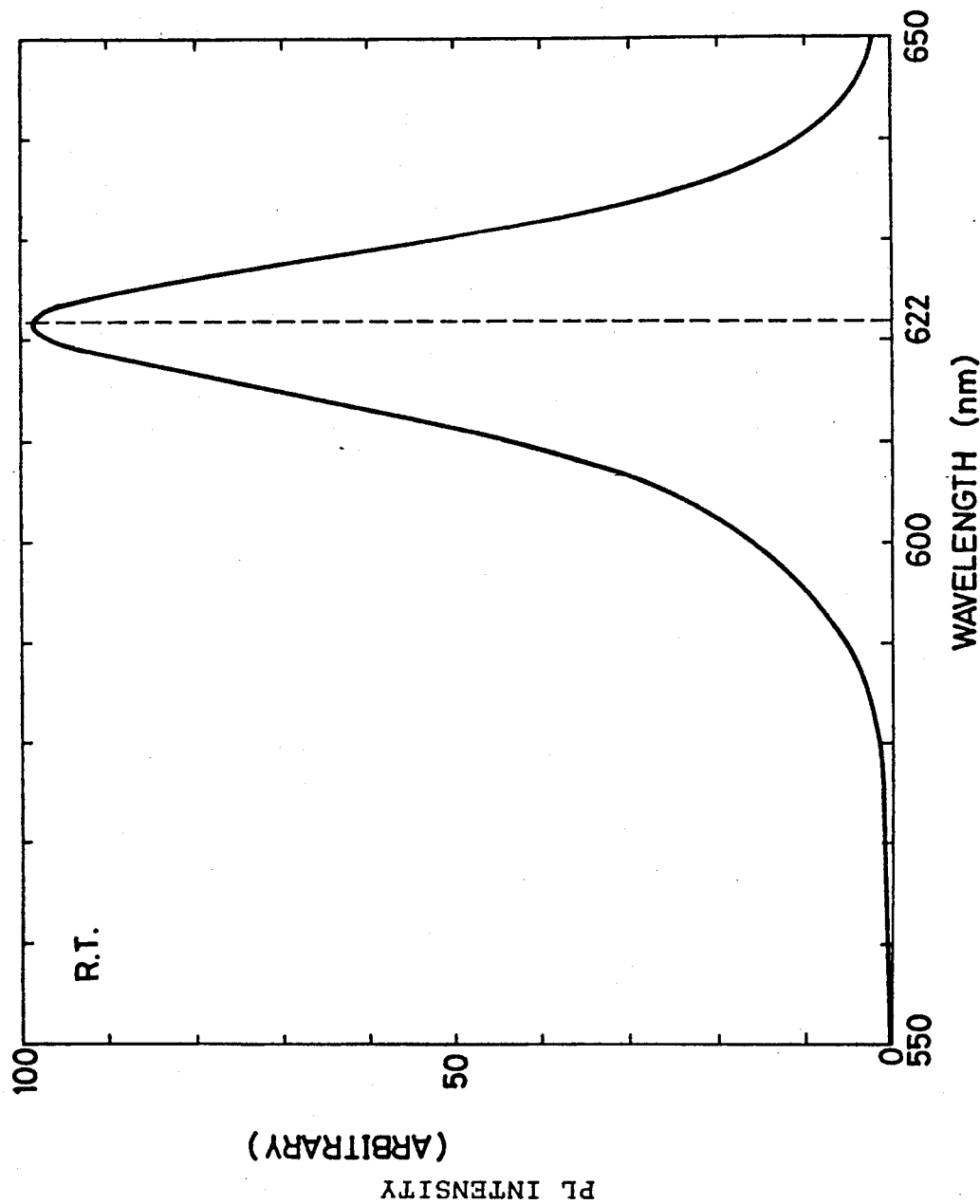

SEMICONDUCTOR LASER DEVICE

BACKGROUND OF THE INVENTION

Field of the Invention.

The present invention relates generally to semiconductor laser devices and methods of manufacturing the same and particularly it relates to an improvement of a compound semiconductor laser device which contains Al, Ga, In P as major constituents for emitting the visible light, and a method of manufacturing the same.

Description of the Background Art

A metal organic chemical vapor deposition (MOCVD) method is an effective method for growing crystals of a GaInP system (or an AlGaInP system). However, many crystal defects are often observed in the crystals of the GaInP system grown by the MOCVD method. For example, when a crystal layer of the GaInP system is grown on the {100}plane of a GaAs substrate by the MOCVD method, about 6000 crystal defects of hillocks, oval in section are generated per 1cm$^2$ on the crystal grown plane.

According to Journal of Crystal Growth, 17(1972), pp. 189–206, it is stated that the number of undesirable pyramid hillocks on the crystal grown surface of the GaAs layer grown by the CVD method on the GaAs substrate can be considerably decreased by using a substrate having a surface inclined by 2° to 5° from the {100}plane in the <110> direction.

In addition, according to Journal of Crystal Growth, 68(1984), pp. 483–489, a semiconductor laser device of the AlGaInP system manufactured by using the MOCVD method is described.

FIG. 1 is a schematic sectional view of such a semiconductor laser device of the AlGaInP system. In this semiconductor laser device, one main surface 1a of an n type GaAs substrate 1 is inclined by 2° from a {100} plane in a <110> direction. An n type GaAs buffer layer 2 of 0.7μm in thickness, an n type $(Al_{0.3}Ga_{0.7})_{0.5}In_{0.5}P$ clad layer 3 of 4μm in thickness, a non-doped $Ga_{0.5}In_{0.5}P$ active layer 4 of 0.23μm in thickness, a p type $(Al_{0.3}Ga_{0.7})_{0.5}In_{0.5}P$ clad layer 5 of 1.4μm in thickness and a p type GaAs cap layer 6 of 1.0μm in thickness are stacked successively on the main surface 1a.

A current blocking layer 7 having a stripe-shaped opening 8 of a width of 20 to 23μm is formed on the cap layer 6. The cap layer 6 exposed in the blocking layer 7 and the opening 8 is covered with a p side Au/Zn electrode layer 9 including a Zn sub layer and an Au sub layer successively stacked. An n side Au/Ge/Ni electrode layer 10 including a Ni sub layer, a Ge sub layer and an Au sub layer successively stacked is formed on the other main surface 1b of the n type GaAs substrate 1.

Semiconductor laser devices as shown in FIG. 1 have disadvantages such as a large variation of oscillation threshold currents between the devices and a deteriorated yield. According to the investigation conducted by the inventors of the present invention, many hillocks were observed on the surface of the cap layer 6 of such a device.

More specifically, as described in Journal of Crystal Growth, 17(1972), pp. 189–204, the utilization of a surface inclined by 2° to 5° from a {100} plane of a GaAs substrate in a <110> direction is effective in suppressing hillocks in the growing process of a GaAs crystal layer by the CVD method but it is not effective in suppressing hillocks in the growing process of an AlGaInP system crystal layer by the MOCVD method.

FIG. 2 is a schematic sectional view showing another conventional semiconductor laser device. An n type $(Al_{0.7}Ga_{0.3})_{0.5}In_{0.5}P$ $(Al_xGa_{1-x})_{0.5}In_{0.5}P$ active layer 13, and a p type $(Al_{0.7}Ga_{0.3})_{0.5}In_{0.5}P$ clad layer 14 are epitaxially grown successively on an n type GaAs substrate 11 by using the MOCVD method or molecular beam epitaxy (MBE) method or the like. Ridges of a width of about 5μm are formed by etching on the p type clad layer 14.

An n type GaAs current blocking layer 15 epitaxially grown by using a mask is formed on the p type clad layer 14. However, the top surfaces of the ridges of the p type clad layer 14 are not covered with the current blocking layer 14. The top surfaces of the ridges of the p type clad layer 14 and the blocking layer 15 are covered with a p type GaAs cap layer 16 epitaxially grown.

A p side electrode layer 17 of Au/Zn/Au is formed on the cap layer 16. On the other hand, an n side electrode layer 18 of AuGe/Au is formed on the other main surface of the n type GaAs substrate 11.

When the Al composition ratio of the active layer 13 of the semiconductor laser device of FIG. 2 is x=0.1, a laser beam of a wavelength of 649 nm is obtained. On the other hand, a He-Ne gas laser device having a wavelength of 632.8 nm is used these days as a light source of a bar code scanner used in a measuring instrument or a point-of-sales (POS) system using visible laser beam. However, such a gas laser device has a large size and a heavy weight and it consumes much power. Accordingly, it is desired to use an AlGaInP system semiconductor laser device having a light weight and a small size with low consumption of power in place of a He-Ne gas laser device, by making a little shorter the wavelength of an AlGaInP system semiconductor laser device.

An AlGaInP system semiconductor laser device capable of emitting laser beam having a shorter wavelength can be obtained by taking one of the following measures:

(1) the composition ratio of Al in the active layer is increased;

(2) the active layer is formed to have a superlattice structure (see Electronics Letters, Vol. 24, 1988, pp. 1489–1490);

(3) each of the semiconductor layers is grown at a temperature higher than 700° C. (see Japanese Journal of Applied Physics, Vol. 27, 1988, pp. 2098–2106); or (4) Zn is diffused in the active layer (see IEEE Journal of Quantum Electronics, QE-23, 1987, pp. 704–711).

For example, if the measure (1) is taken in the case of the composition ratio of Al in the active layer 13 being x=0.2, the oscillation wavelength is 630 nm to 40 nm, which value is substantially equal to the wavelength of a He-Ne laser beam. However, if the composition ratio of Al in the active layer 13 is increased, the quality of crystals of the active layer 13 is lowered and the oscillation threshold current is increased, making it difficult to carry out continuous operation of the semiconductor laser device. If the measure (2), (3) or (4) is taken, oscillation operation of the semiconductor laser device becomes unstable, resulting in a low yield of manufacturing and a considerable deterioration of the active layer 13, making the life of the device short.

SUMMARY OF THE INVENTION

In view of the above described related art, an object of the present invention is to provide an AlGaInP system semiconductor laser device having little variation of oscillation threshold current and a good yield, and a method of manufacturing the same.

Another object of the present invention is an AlGaInP system semiconductor laser device having a long life, and a method of manufacturing the same.

Still another object of the present invention is to provide an AlGaInP system semiconductor laser device having an oscillation wavelength substantially equal to a wavelength of a He-Ne gas laser beam, and a method of manufacturing the same.

A semiconductor laser device according to an aspect of the present invention comprises: a GaAs substrate of a first conductivity type; a buffer layer of the first conductivity type containing Ga, In and P, formed on one main surface inclined by 5° or more from a {100} plane of the GaAs substrate in a <011> direction; a clad layer of the first conductivity type containing Al, Ga, In and P, formed on the buffer layer; an active layer containing at least Ga, In and P, formed on the clad layer of the first conductivity type; and a clad layer of a second conductivity type containing Al, Ga, In and P, formed on the active layer.

A semiconductor laser device according to another aspect of the present invention comprises an active layer further containing Al in addition to Ga, In and P.

A method of manufacturing a semiconductor laser device according to a further aspect of the present invention comprises the steps of: forming a main surface inclined by 5° or more from a {100} plane of a GaAs substrate of a first conductivity type in a <011> direction, forming a buffer layer of the first conductivity type containing Ga, In and P on the main surface by MOCVD, forming a clad layer of the first conductivity type containing Al, Ga, In and P on the buffer layer by MOCVD, forming an active layer containing at least Ga, In and P on the clad layer of the first conductivity type by MOCVD, and forming a clad layer of a second conductivity type containing Al, Ga, In and P on the active layer by MOCVD.

In a method of manufacturing a semiconductor laser device according to a still further aspect of the present invention, an active layer further containing Al in addition to Ga, In and P is formed by MOCVD.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A and 8B are graphs showing PL light intensity distributions concerning PL light wavelengths in $(Al_{0.15}Ga_{0.85})_{0.5}In_{0.5}P$ layers in the cases in which respective main surfaces of GaAs substrates are inclined by 0° and 5°, respectively from {100} planes thereof in a <011> direction.

DESCRIPTION OF THE PREFERRED EMBODIMENTS

Figure 1:
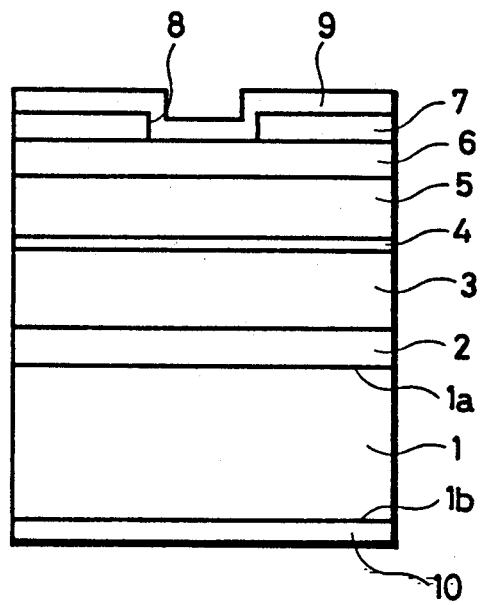
FIG. 1 is a sectional view of a conventional semiconductor laser device.
Figure 2:
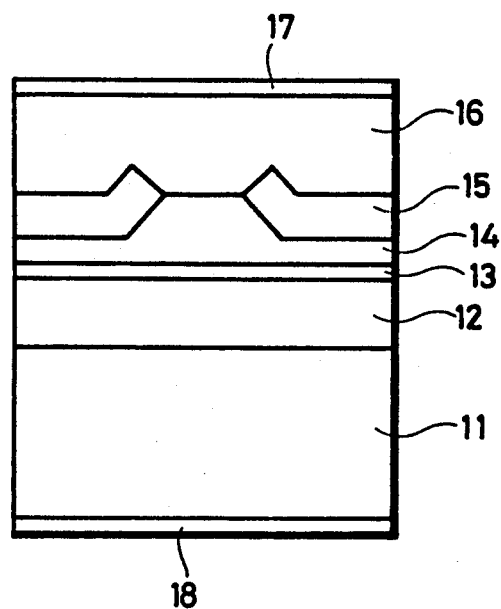
FIG. 2 is a sectional view of another conventional semiconductor laser device.
Figure 3:
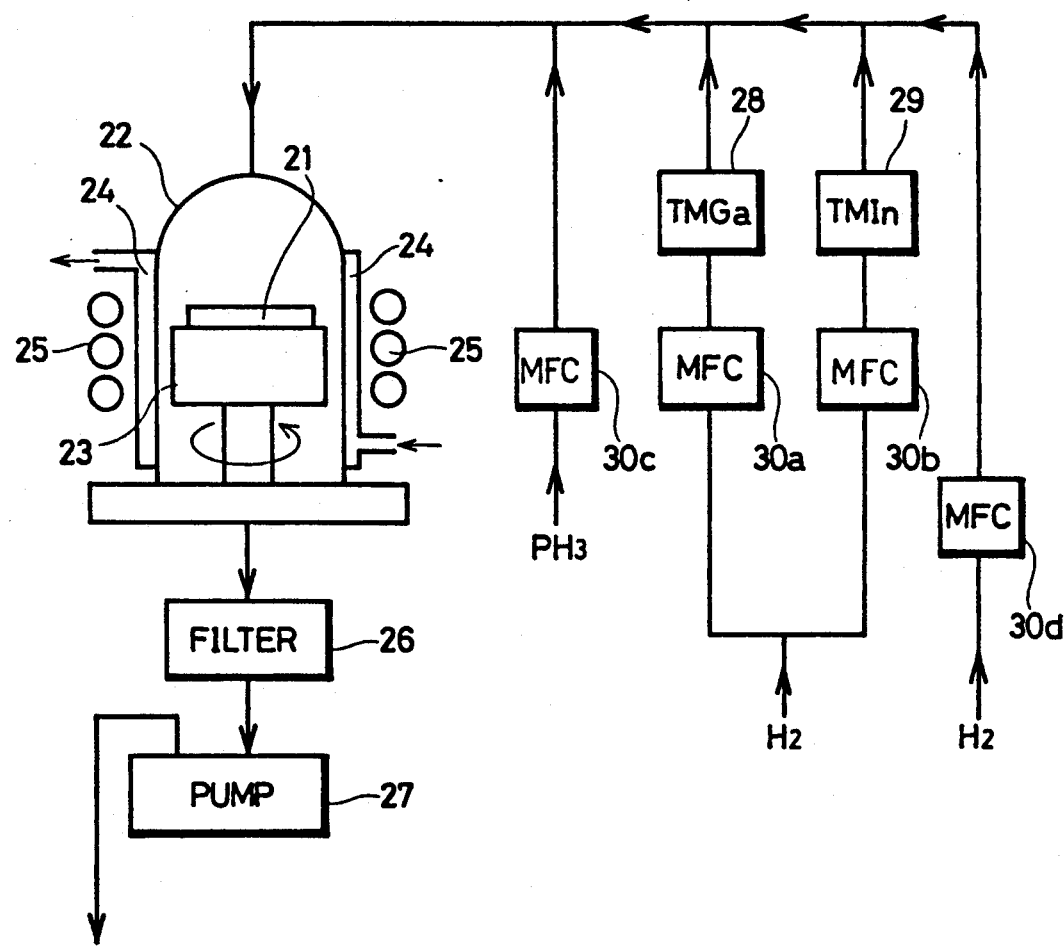
FIG. 3 is a block diagram of a crystal growth apparatus used in the present invention.

Referring to FIG. 3, a GaAs substrate 21 is mounted on a susceptor 23 in a reaction container 22. The susceptor 23 is rotated at a speed of 8 to 10 rpm while a crystal layer is being grown on the substrate 21. Water flow tubes 24 closely fixed to the external wall of the container 22 cool the container 22. A radio frequency (RF) coil 25 wound on the container 22 enables the susceptor 23 to be heated. The container 22 is evacuated by a rotary pump 27 through a filter 26.

For example, a reaction gas containing trimethyl gallium (TMGa) is obtained by bubbling a solution of TMGa by $H_2$ gas introduced into a solution tank 28 through a mass flow controller (MFC) 30a. Similarly, a solution of trimethyl indium (TMIn) in a solution tank 29 is bubbled by $H_2$ gas introduced through an MFC 30b. Another reaction gas $PH_3$ and carrier gas $H_2$ are introduced into the reaction container 22 through MFCs 30c and 30d, respectively. Needless to say, a further desired gas can be introduced into the reaction container 22.

In the crystal growth apparatus shown in FIG. 3, the temperature of the GaAs substrate 22 was maintained at 640° C. The reaction gasses were introduced into the reaction container 22 with a flow rate ratio of $PH_3$ gas/(TMGa gas + TMIn gas) $\iota$ 500. The pressure in the container 22 was maintained at 70 Torr and an InGaP system crystal layer of about 1.2 μm in thickness was grown on the GaAs substrate 21 by the MOCVD method. In order to prevent As atoms from diffusing from the substrate 21, it is desirable to introduce arsine gas into the container 22 during a period of heating the GaAs substrate 21 before the start of the crystal growth.

Table I shows defect concentrations (the number of hillocks per 1 $cm^2$) measured in InGaP system crystal layers grown on GaAs substrates having various plane orientations, and photoluminescences measured in the InGaP system crystal layers excited by argon laser (having a wavelength of 5145Å). The photoluminescences were measured at 10K.

TABLE I

| | substrate plane orientation | crystal defect concentration | photoluminescence (measured at 10K) | |
|---|---|---|---|---|
| | | | emission energy (eV) | half-value width (meV) |
| embodiment | inclined by 5° from {100} plane in <011> direction | about 100 | 1.954 | 9.0 |
| samples for comparison | {100} plane | about 6,000 | 1.877 | 21.0 |
| | inclined by 2° from {100} plane in <011> direction | about 1,000 | 1.887 | 20.0 |
| | inclined by 2° from {100} plane in <01$\bar{1}$> direction | about 4,000 | 1.875 | 15.0 |
| | inclined by 2° from {001} plane in <011> direction | about 3,000 | 1.875 | 14.0 |

As is evident from Table I, the defect concentration in the InGaP system crystal layer grown on the GaAs substrate having a surface inclined by 5° from a {100} plane in a <011> direction is by far smaller than those in the InGaP system crystal layers on the GaAs substrates having respective surfaces inclined by less than 5° from the respective {100} planes in the <011> direction. In addition, the narrow half-value width of 9.0 meV in photoluminescence of the InGaP system crystal layer on the GaAs substrate having a surface inclined by 5° from the {100} plane in the <011> direction shows a good quality of crystals.

The growing conditions of the crystal layer can be changed as required. For example, the crystal layer can be grown at a temperature in the range of 620° C. to 670° C. In addition, not only an InGaP system crystal layer but also an InGaAlP system crystal layer can be grown. However, the surface of the GaAs substrate needs to be inclined with an angle of 5° or more, preferably in the range of 5° to 7° from the {100} plane in the <011> direction and, otherwise, a crystal layer having a sufficiently small defect concentration could not be grown.

Figure 4:
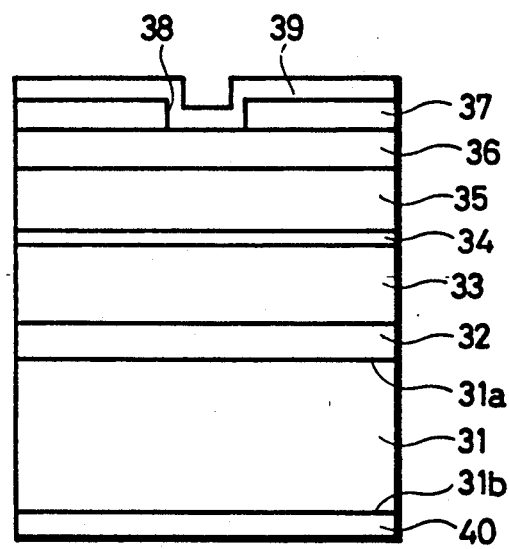
FIG. 4 is a sectional view of a semiconductor laser device according to an embodiment of the invention.

Referring to FIG. 4, a sectional view of a semiconductor laser diode according to an embodiment of the present invention is illustrated. An n type GaAs substrate 31 having a carrier concentration of $2 \times 10^{18}$cm$^{-3}$ has a main surface 31a inclined by 5° or more, e.g., 5° from a {100} plane in a <011> direction. An n type buffer layer 32, an n type clad layer 33, an active layer 34, a p type clad layer 35 and a p type cap layer 36 are stacked successively on the main surface 31a. Those semiconductor crystal layers are grown at a crystal growth temperature in the range of 620° C. to 670° C., e.g., 670° C. under a reduced pressure of 70 Torr by the MOCVD method.

Table II shows various conditions of the semiconductor layers thus grown.

TABLE II

| | composition | carrier concentration (cm$^{-3}$) | dopant | layer thickness (μm) |
|---|---|---|---|---|
| buffer layer 32 | n-Ga$_{0.5}$In$_{0.5}$P | $5 \times 10^{17}$ | Se | 0.5 |
| n type clad layer 33 | n-(Al$_{0.5}$Ga$_{0.5}$)$_{0.5}$In$_{0.5}$P | $8 \times 10^{17}$ | Se | 1.0 |
| active layer 34 | Ga$_{0.5}$In$_{0.5}$P | — | — | 0.08 |
| p type clad layer 35 | p-(Al$_{0.5}$Ga$_{0.5}$)$_{0.5}$In$_{0.5}$P | $7 \times 10^{17}$ | Mg | 0.8 |
| cap layer 36 | p-GaAs | $5 \times 10^{18}$ | Mg | 0.3–0.5 |

A current blocking layer 37 of SiO$_2$ is formed on the cap layer 36 by sputtering. A stripe-shaped opening 38 for passage of current is formed in the blocking layer 37 by etching. A Cr sub layer and an Au sub layer are provided successively by vacuum evaporation to cover the cap layer 36 and the blocking layer 37 exposed in the opening 38, whereby a p side Au/Cr electrode layer 39 is formed. A Cr sub layer, an Sn sub layer and an Au sub layer are provided successively by vacuum evaporation on the other main surface 31b of the substrate 31, whereby an n side Au/Sn/Cr electrode layer 40 is formed. The p side electrode layer 39 and the n side electrode layer 40 are thermally treated at 400° C., so as to be in ohmic contact with the cap layer 36 and the substrate 31, respectively.

Figure 5A:
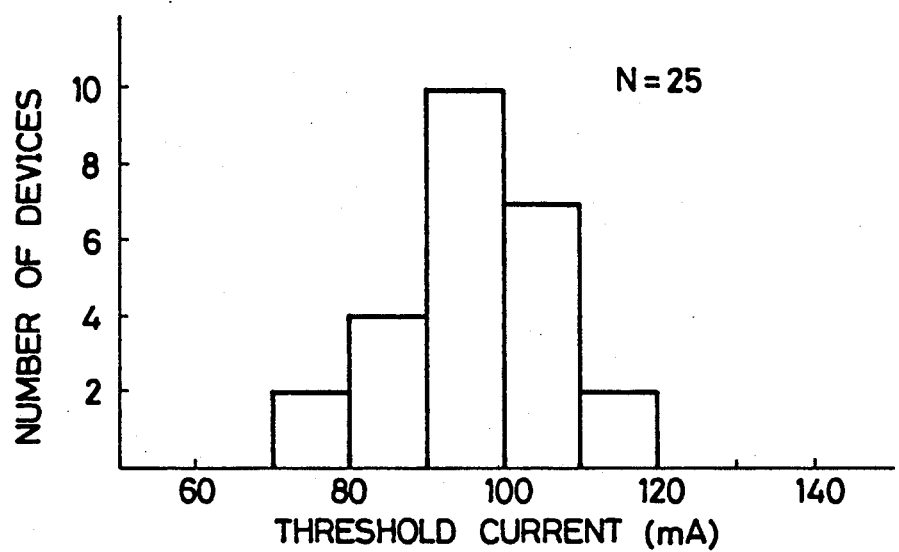
FIG. 5A is a histogram showing oscillation threshold current in semiconductor laser devices according to the present invention.

Referring to FIG. 5A, there is shown a histogram representing variation of oscillation threshold currents in 25 semiconductor laser devices according to the embodiment, manufactured by using n type GaAs substrates 31 having respective main surfaces 31a inclined by 5° from the {100} planes thereof in the <011> direction. The abscissa in this histogram represents the threshold current and the ordinate represents the number of semiconductor laser devices.

Figure 5B:
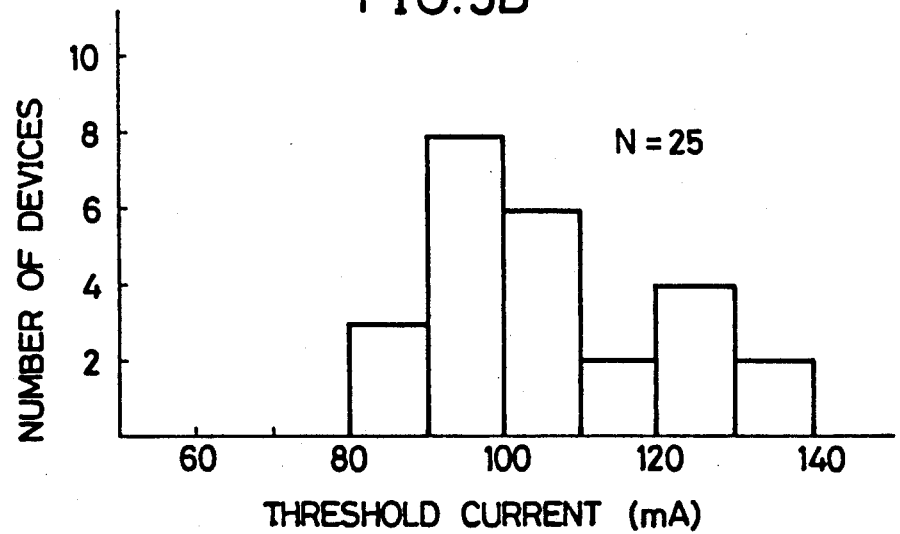
FIG. 5B is a histogram showing threshold current in semiconductor laser devices for comparison.

FIG. 5B, which is similar to FIG. 5A, represents variation of threshold currents in 25 semiconductor laser devices for comparison, manufactured by using n type GaAs substrates having respective main surfaces inclined by 2° from the {100} planes thereof in the <011> direction.

As is evident from the comparison of FIGS. 5A and 5B, the variation of the threshold currents in the semiconductor laser devices according to the embodiment is smaller than that in the semiconductor laser devices for comparison. In addition, an average threshold current in the semiconductor laser devices according to the embodiment is smaller than that in the semiconductor laser devices for comparison. Thus, according to the present invention, the manufacturing yield of semiconductor laser devices is improved and the life thereof becomes long.

In addition, 1000 to 10000 cm$^{-2}$ hillocks were observed in the cap layer of each of the semiconductor laser devices, while only less than about 100 cm$^{-2}$ hillocks were observed in the cap layer of each of the semiconductor laser devices according to the embodiment of the present invention. Accordingly, it is considered that the decrease of the variation of the threshold currents in the semiconductor laser devices according to the embodiment is achieved by the decrease of hillocks and consequently by the improvement of the quality of crystals.

Although the semiconductor laser device using the n type GaAs substrate having the main surface 31a inclined by 5° from the {100} plane in the <011> direction was described in the above mentioned embodiment, the main surface 31a may be inclined by 5° or more from the {100} plane in the <011> direction and, preferably, it is inclined with an angle in the range of 5° to 7°. An angle of inclination of less than 5° could not contribute to an improvement of the quality of crystals and, conversely, it would take much time to form a main surface of a substrate inclined by more than 7°. Further, if the inclination angle of the substrate exceeds 7°, the threshold current of the semiconductor laser device would tend to be increased and therefore such angles outside the above mentioned prescribed range are not practical.

Furthermore, in order to suppress increase of the operation voltage in the semiconductor laser diode of FIG. 4, an intermediate layer of Ga$_{0.5}$In$_{0.5}$P may be interposed between the p type clad layer 35 and the cap layer 36.

In addition, although the oxide stripe type laser device having the blocking layer of SiO$_2$ was described in the above embodiment, it is clear for those skilled in the art that the present invention is applicable to semiconductor laser devices of other various types.

In the following, a second embodiment of the present invention will be described.

The inventors of the present invention found that an energy band gap of an AlGaInP system semiconductor layer grown on a GaAs substrate changes dependent on the surface orientation of the substrate.

Figure 6:
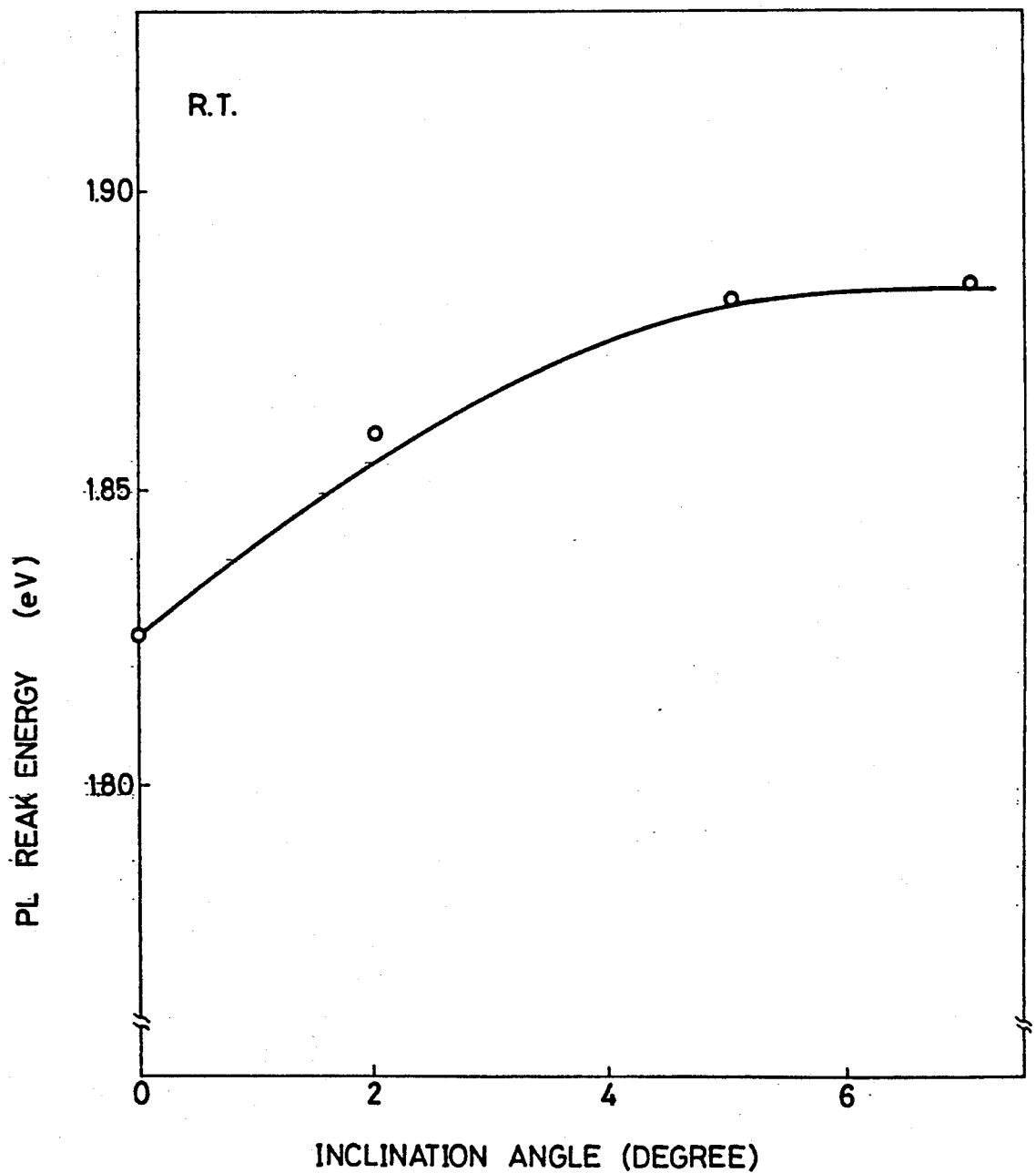
FIG. 6 is graph showing photoluminescence (PL) peak energy of a $Ga_{0.5}In_{0.5}P$ layer formed on a main surface of a GaAs substrate in relation to the inclination angle of the main surface.

Referring to FIG. 6, there is shown a relation between an inclination angle of the surface of the GaAs substrate and a PL peak energy of a Ga$_{0.5}$In$_{0.5}$P layer grown on the surface of the substrate. The abscissa in FIG. 6 represents an inclination angle of the GaAs substrate surface from the {100} plane in the <011> direction, and the ordinate represents the PL peak energy of the Ga$_{0.5}$In$_{0.5}$P layer. The Ga$_{0.5}$In$_{0.5}$P layer was formed at 670° C. under the pressure of 70 Torr by the MOCVD method. The PL peak energy was measured at the room temperature. As is evident from the graph of FIG. 6, the PL peak energy increases according to the increase of the inclination angle of the substrate surface and, when the inclination angle is 5° or more, the PL peak energy approaches a prescribed saturation value. ratio x of Al of an (Al$_x$Ga$_{1-x}$)$_{0.5}$In$_{0.5}$P layer (1>x>0) and a PL peak wavelength is shown. The abscissa represents the composition ratio x of Al, and the ordinate represents the PL peak wavelength (nm) of the (Al$_x$Ga$_{1-x}$)$_{0.5}$In$_{0.5}$P layer. The surface of the GaAs substrate was inclined by 0°, 5° or 7° from a {100} plane in a <011> direction. A Ga$_{0.5}$In$_{0.5}$P layer was formed on the GaAs substrate and an {Al$_x$Ga$_{1-x}$}$_{0.5}$In$_{0.5}$P layer was formed thereon.

Figure 8A:
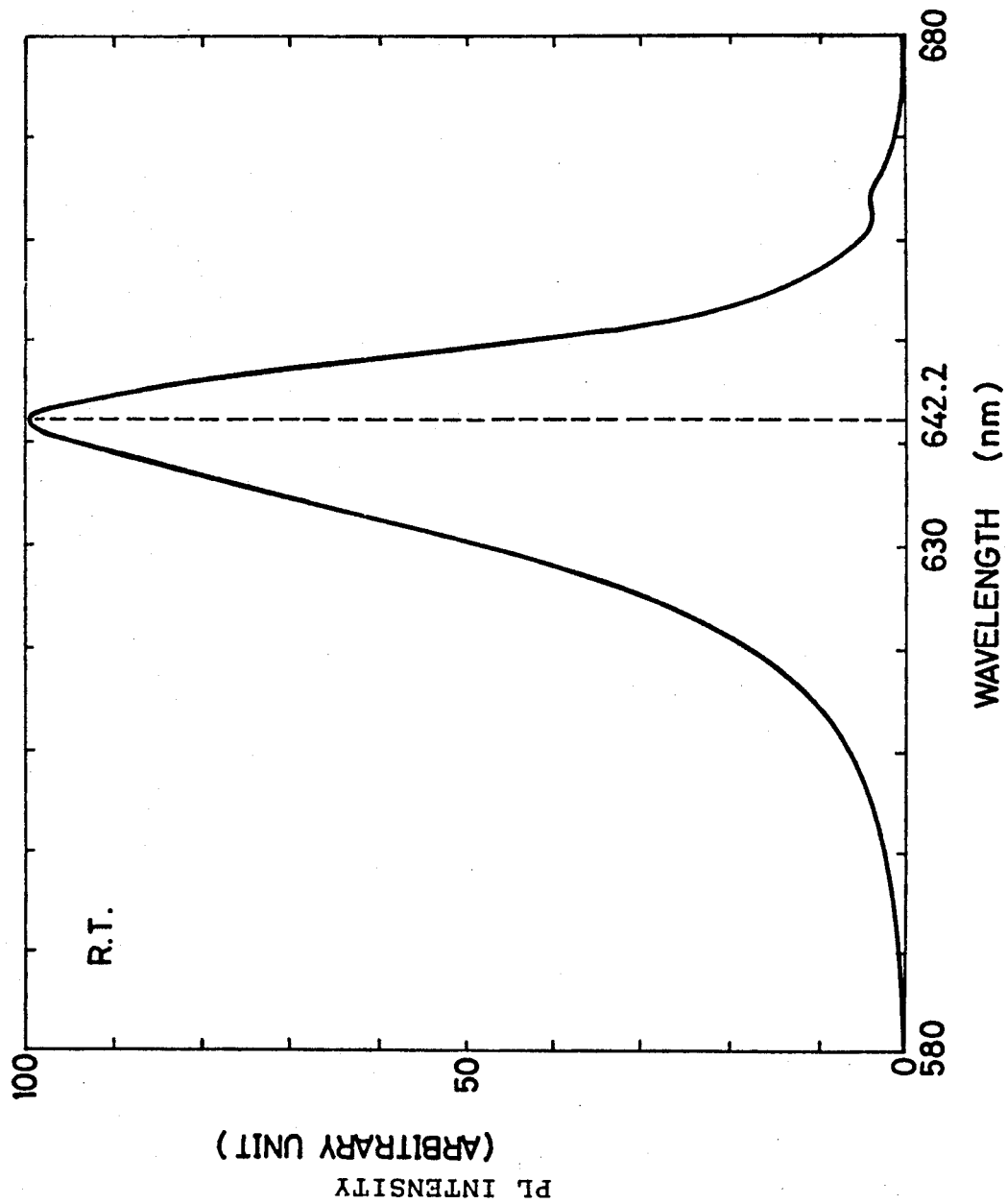

FIGS. 8A and 8B show respectively PL light intensity distributions concerning the PL light wavelengths of the (Al$_{0.15}$Ga$_{0.85}$)$_{0.5}$In$_{0.5}$P layers in the cases of the GaAs substrate surfaces being inclined by 0° and 5° from the respective {100} planes thereof in the <011> direction. In each of FIGS. 8A and 8B, the abscissa represents the PL light wavelength, and the ordinate represents the PL light intensity. The PL was measured at the room temperature.

Figure 7:
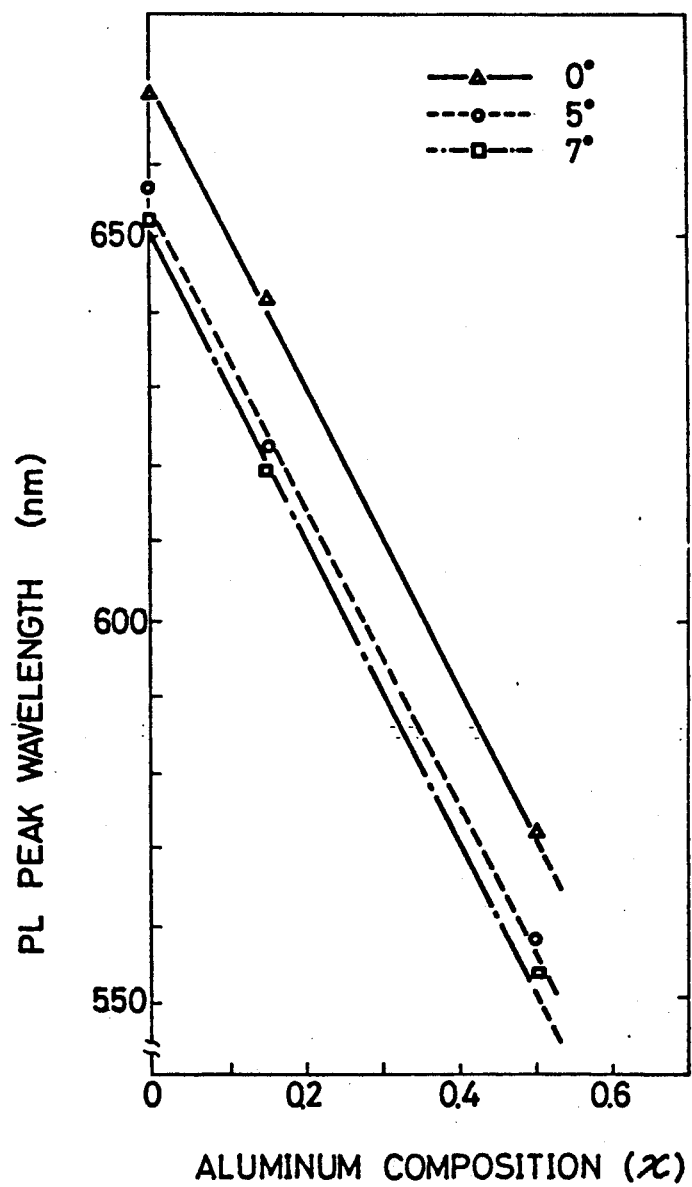
FIG. 7 is a graph showing PL peak energy of a $(Al_x Ga_{1-x})_{0.5}In_{0.5}P$ layer (1>x>0) on a $Ga_{0.5}In_{0.5}P$ layer formed on a main surface of a GaAs substrate in relation to the composition (x) of Al.

As is evident from FIG. 7, the change amount of the PL peak wavelength due to the inclination of each substrate surface is substantially constant independent of the Al composition ratio x. For example, as shown in FIGS. 8A and 8B, if the Al composition ratio is x=0.15, the PL peak wavelengths in the cases of the inclination angles of the substrate surfaces being 0° and 5° are 642.2 nm and 622.0 nm, respectively, and the change amount of the wavelengths in both cases is about 20 nm. The PL peak wavelength of the (Al$_x$Ga$_{1-x}$)$_{0.5}$In$_{0.5}$P layer tended to a prescribed saturation value with the inclination angle of the substrate surface being in the range of 5° or more, in the same manner as in the case of the Ga$_{0.5}$In$_{0.5}$P layer shown in FIG. 6.

Based in the above described investigation by the inventors of the present invention, it was found that it is possible to shorten a wavelength of a laser beam by inclining the substrate surface from the {100} plane in the <011> direction in an AlGaInP system semiconductor laser device. However, the inclination angle of the substrate surface is selected to be 5° or more, preferably, in the range of 5° to 7°. This is because a sufficiently short wavelength of laser beam can be obtained even if the Al composition ratio x is small in the case of the inclination angle of the substrate surface being 5° or more and the number of hillocks in the semiconductor layer can be decreased to 100 cm$^{-2}$ or less.

Figure 9:
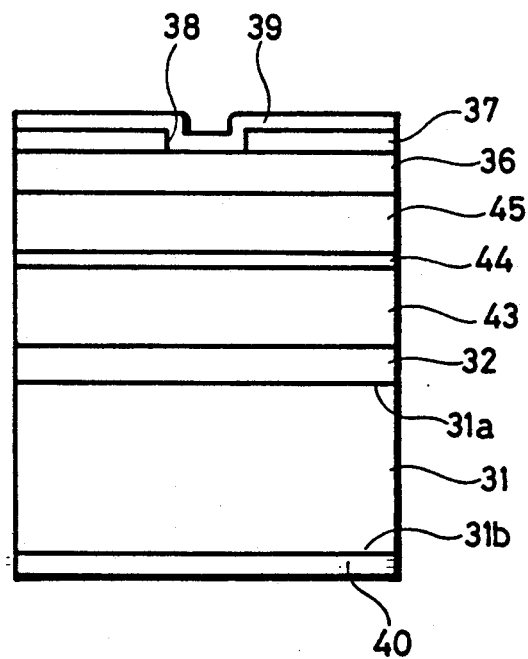
FIG. 9 is a sectional view of a semiconductor laser device according to another embodiment of the invention.

Referring to FIG. 9, a semiconductor laser device according to the second embodiment of the invention is shown. Table III shows various conditions of the semiconductor layers included in this semiconductor laser device.

TABLE III

| | composition | carrier concentration (cm$^{-3}$) | dopant | layer thickness (μm) |
|---|---|---|---|---|
| buffer layer 32 | Ga$_{0.5}$In$_{0.5}$P | 5 × 10$^{17}$ | Se | 0.5 |
| n type clad layer 43 | (Al$_{0.7}$Ga$_{0.3}$)$_{0.5}$In$_{0.5}$P | 8 × 10$^{17}$ | Se | 1.0 |
| active layer 44 | (Al$_{0.15}$Ga$_{0.85}$)In$_{0.5}$P | — | — | 0.08 |
| p type clad layer 45 | (Al$_{0.7}$Ga$_{0.3}$)$_{0.5}$In$_{0.5}$P | 7 × 10$^{17}$ | Mg | 0.8 |
| cap layer 36 | GaAs | 5 × 10$^{18}$ | Mg | 0.3–0.5 |

The semiconductor laser device in FIG. 9 is similar to that in FIG. 4, except that only the compositions of the n type clad layer 43, the active layer 44 and the p type clad layer 45 are changed. Accordingly, the device in FIG. 9 is manufactured by the same process as that in FIG. 4.

Although the semiconductor laser device including the active layer 44 having the Al composition ratio of x = 0.15 was described in connection with the second embodiment, those skilled in the art will easily understand that Al composition ratio x can be changed in order to obtain a laser beam having a desired wavelength. For example, in order to obtain a wavelength of about 630 nm approximate to the wavelength of the He-Ne gas laser beam, the Al composition ratio x of the active layer 44 can be selected to be in the range of 0.1 to 0.15 with the inclination angle of the substrate surface 31a being 5° or more.

In the semiconductor laser device in FIG. 9, the Al composition ratio for obtaining a laser beam of a short wavelength can be made small compared with the conventional devices and accordingly increase of the threshold current can be suppressed. In addition, since the number of crystal defects in each semiconductor layer is small, there is less variation of the threshold current and the life of the device is increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor laser device comprising:
a GaAs substrate of a first conductivity type,
a buffer layer of the first conductivity type containing Ga, In and P, formed on one main surface of said GaAs substrate inclined by 5° or more from a {100} plane of said substrate in a <011> direction,
a clad layer of the first conductivity type containing Al, Ga, In and P, formed on said buffer layer,
an active layer containing Ga, In and P, formed on said clad layer of the first conductivity type, and
a clad layer of a second conductivity type containing Al, Ga, In and P, formed on said active layer.

2. The device of claim 1, wherein said main surface is inclined in the range of from about 5° to about 7° from the {100} plane in the <011> direction.

3. The device of claim 1, wherein compositions of said buffer layer, said clad layers and said active layer are $Ga_{0.5}P$, $(Al_{0.5}Ga_{0.5})_{0.5}In_{0.5}P$, and $Ga_{0.5}In_{0.5}P$, respectively.

4. The device of claim 1, wherein said active layer further contains Al.

5. The device of claim 4, wherein said clad layers and said active layer have a composition of $(Al_xGa_{1-x})_{0.5}In_{0.5}P$ and the values of x in said clad layer being greater than in said active layer.

6. The device of claim 5, wherein the value of x in said active layer is in the range of 0.1 to 0.15.

7. The device of claim 1, wherein said buffer layer of the first conductivity type and said clad layer of the first conductivity type are doped with Se as an n type impurity, and said clad layer of the second conductivity type is doped with Mg as a p type impurity.

8. The device of claim 1, wherein said buffer layer of the first conductivity type, said clad layer of the first conductivity type, said active layer and said clad layer of the second conductivity type have thicknesses of about 0.5 μm, 1.0 μm, 0.08 μm and 0.8 μm, respectively.

9. The device of claim 1, further comprising a GaAs cap layer of the second conductivity type formed on said clad layer of the second conductivity type.

10. The device of claim 9, further comprising a current blocking layer of $SiO_2$ formed on said cap layer of the second conductivity type, said blocking layer having a stripe-shaped opening for enabling passage of current.

* * * * *

UNITED STATES PATENT AND TRADEMARK OFFICE
CERTIFICATE OF CORRECTION

PATENT NO. : 5,016,252
DATED : May 14, 1991
INVENTOR(S) : Hamada et al

It is certified that error appears in the above-identified patent and that said Letters Patent is hereby corrected as shown below:

Column 10, line 8, (claim 3) "$Ga_{0.5}P$" is incomplete and should be corrected to read --$Ga_{0.5}In_{0.5}P$--.

Signed and Sealed this

Seventeenth Day of November, 1992

Attest:

DOUGLAS B. COMER

Attesting Officer

Acting Commissioner of Patents and Trademarks